Feb. 25, 1958 S. YANDO 2,825,029
REACTANCE TUBE CIRCUITRY
Filed June 3, 1955
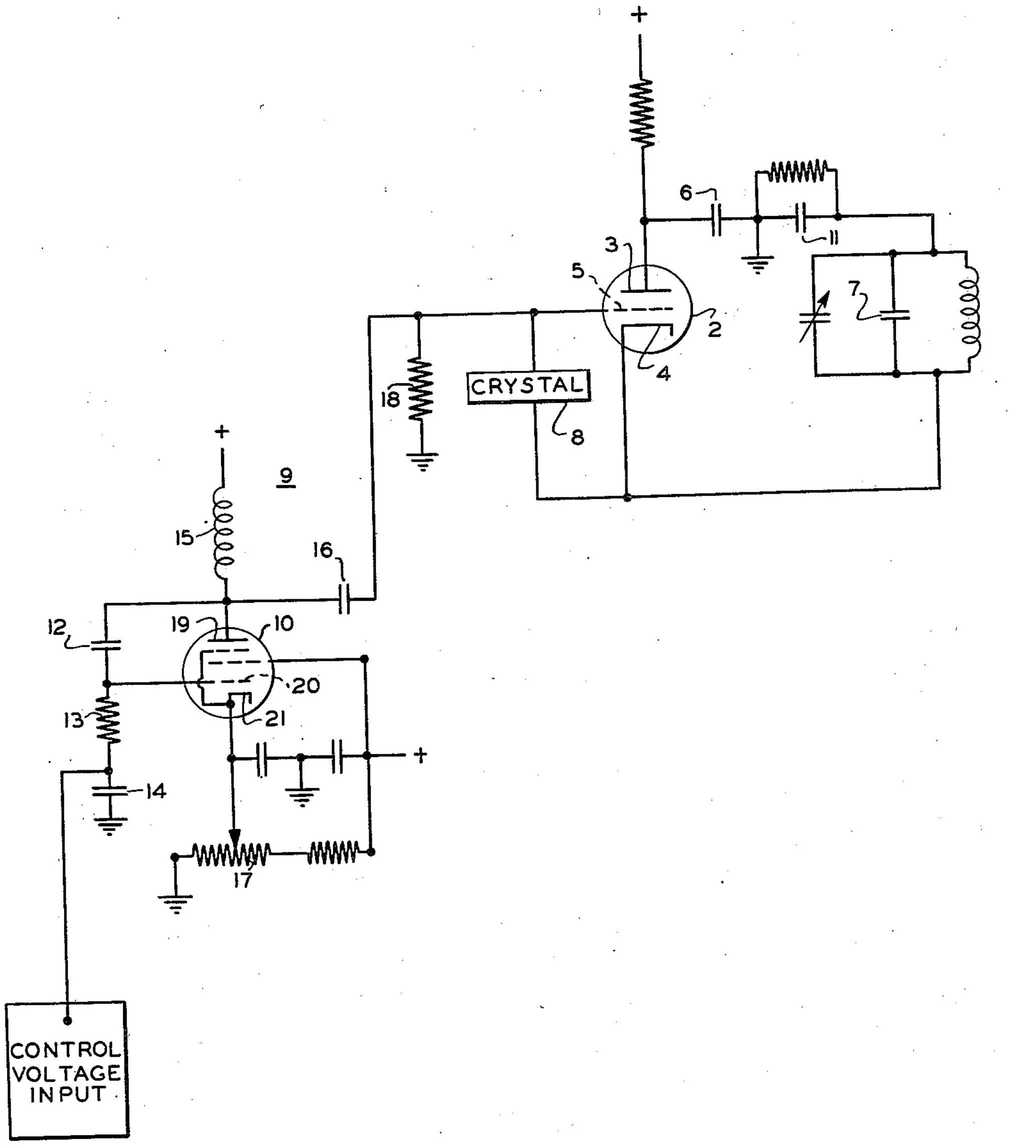
INVENTOR
STEPHEN YANDO
BY Theodore C. [signature]
ATTORNEY 2,825,029

REACTANCE TUBE CIRCUITRY

Stephen Yando, Huntington, N. Y., assignor to Sylvania Electric Products Inc., a corporation of Massachusetts Application June 3, 1955, Serial No. 512,987

4 Claims. (Cl. 332—28)

My invention relates to electronic oscillators and reactance tube circuitry for controlling the oscillator frequency.

A reactance tube circuit essentially comprises an amplifier provided with a network connected between the plate and the grid of the reactance tube to cause the plate current through the tube to lead or lag the plate voltage by 90°; thus the tube represents an effective inductance or capacitance. When a control signal is supplied to the control grid, the plate current varies accordingly and the tube acts as a variable reactance. In order to control the frequency of an oscillator, the anode-cathode circuit of the reactance tube is generally connected in shunt across the frequency determining or tank circuit of the oscillator, to change the resonant frequency of the tank circuit in accordance with the variations in the control signal.

When the frequency determining circuit of the oscillator is a crystal (conventionally connected in the grid circuit of the oscillator tube), this conventional reactance tube frequency control arrangement has certain inherent disadvantages. For example, since the crystal represents a series circuit whose resonant frequency determines the frequency of oscillation, the connection of a reactance tube in shunt across the crystal sharply reduces the overall impedance. This reduced impedance accordingly reduces the circuit coupling to the crystal, and oscillations cease before the frequency of the oscillator has been shifted appreciably. Thus, the frequency shift obtained through reactance tube frequency control of a crystal controlled oscillator is approximately between .01 and .02% of the nominal crystal frequency.

Accordingly, it is an object of the present invention to improve reactance tube controlled oscillator circuitry in such manner that a larger range of frequency control is obtained.

Another object is to provide a new and improved reactance tube controlled crystal oscillator circuit in which the circuit coupling between crystal and the oscillator itself is relatively unaffected by the changes in resonant frequency established through reactance tube control.

Yet a further object is to provide a new and improved reactance tube controlled oscillator circuit in which the reactance tube is connected between the anode and control grid of the oscillator tube.

These and other objects of my invention will either be explained or will become apparent hereinafter.

In accordance with my invention there is provided an oscillator including a first electron discharge tube having a cathode, an anode and a control grid and further including first and second tuned circuits coupled between the grid and cathode and the anode and cathode respectively.

I further provide a reactance tube circuit including a second electron tube having a cathode, an anode and a control grid and further provided with a 90° phase shifting network coupled between the plate and grid of the second tube, the anode-cathode circuit of the second tube being interconnected between the anode and control grid of the first tube. In this manner, the variable reactance represented by the reactance tube does not shunt the first tuned circuit as in known systems, but rather is used as a variable feedback reactance interconnecting the output and input of the oscillator circuit. When a control signal is supplied to the control grid of the reactance tube to change the value of the apparent reactance represented thereby, the oscillator frequency is shifted in accordance with this variation. However, for example, if the first tuned circuit is a crystal, the coupling between the crystal and the grid circuit of the oscillator is not appreciably affected so that oscillations can be sustained over a wider frequency range than heretofore known.

An illustrative embodiment of my invention will now be described in more detail with reference to the accompanying drawing.

Referring now to the figure, there is provided a conventional tuned-plate, tuned-grid oscillator identified generally at 1 and including an electron tube 2 provided with an anode 3, a cathode 4, and a control grid 5. The anode is connected through a resistor to a source of operating potential in conventional manner, and is also connected, through capacitors 6 and 11 and the tuned plate resonant circuit 7, to the cathode 4. A crystal 8, which represents the tuned grid portion of the oscillator, is connected between the grid 5 and cathode 4. The junction of capacitors 6 and 11 is grounded. Similarly, the control grid 5 of tube 2 is connected through resistor 18 to ground.

There is also provided reactance tube control apparatus identified generally at 9 and including pentode 10. A phase shifting network and including in the order named, capacitor 12, resistance 13 and bypass capacitor 14, interconnects the anode 19 and control grid 20 of pentode 10. The control voltage (which in this example is a direct voltage) for varying the reactance represented by the pentode is applied between the junction of resistor 13 and capacitor 14 and ground. Operating potential is supplied in conventional manner through choke 15 to anode 19. This anode is also connected through coupling capacitor 16 to the control grid of tube 2. The cathode 21 of the pentode is connected through a potentiometer 17 to ground. Both cathodes 4 and 7 are of the indirectly heated type. The heater connections are conventional and are not shown here.

It will be apparent from the foregoing that the anode-cathode circuit of the reactance tube is interconnected, for alternating current, between the control grid and anode of tube 2. Consequently, the reactance tube does not shunt the crystal 8 but becomes a variable feedback reactance intercoupling the anode and grid of tube 2. As a result, when the apparent reactance represented by the reactance tube 10 is shifted in accordance with the variations of the direct control voltage applied to the control grid thereof, the oscillator frequency is shifted in accordance with this variation without changing the coupling between the crystal and the remaining portion of the oscillator.

When the above arrangement was used with an oscillator tube of the type commercially designated as a 6AB4, and a reactance tube designated as a 6AH6, the nominal crystal frequency being 3.58 megacycles per second, frequency shifts as high as 3100 cycles were obtained. The shifts were in excess of .085% of the nominal crystal frequency; stated differently, the frequency range of control established by this system is between five and ten times as large as that obtained by conventional systems.

The ground connection for the anode 3 of tube 2 has been made for purposes of convenience only. For example, the cathode 4 can be grounded instead. However, this arrangement would result in a "floating" reactance tube with consequent stabilization problems avoided by the arrangement shown.

While I have shown and pointed out and described my invention in the various preferred embodiments, it will be apparent to those skilled in the art that many other modifications can be made within the scope and sphere of my invention as defined in the claims which follow.

What is claimed is:

1. In combination with an oscillator including an oscillator tube having an anode, a cathode and a control grid, and further including a first tuned circuit coupled between the grid and cathode of the oscillator tube and a second tuned circuit coupled between the anode and cathode of the oscillator tube, a reactance tube arrangement including a reactance tube having a cathode, an anode and a control grid and further including a phase shifting network coupled between the anode and grid of the reactance tube to cause the current through the reactance tube to be in quadrature with the anode voltage thereon, the anode-cathode current path through said reactance tube being interposed between the grid and a connection point intermediate said anode and said second circuit of said oscillator tube.

2. The combination as set forth in claim 1 wherein said first tuned circuit is a crystal.

3. The combination as set forth in claim 1 wherein both the anode and cathode of said oscillator tube are coupled to an alternating current ground connection, one of said anode and cathode being grounded through a high impedance path, the other being grounded through a low impedance path.

4. An oscillator comprising an oscillator section including an oscillator tube having cathode, anode, and control grid electrodes, and a tuned crystal element interconnecting said grid and cathode electrodes; a reactance tube section including a reactance tube device having an anode, a cathode and a control grid, said anode being coupled for alternating voltage to said grid electrode, said cathode being coupled for alternating voltages to said anode electrode, said device further including a phase shifting network coupled between said grid and said anode to shift the discharge current through said device at an angle of substantially 90° with respect to the alternating voltage appearing between said anode and said cathode; and means to supply a control voltage to said grid to shift the oscillator frequency accordingly whereby the coupling between said tube and said element is substantially constant despite said frequency shifts.

References Cited in the file of this patent

UNITED STATES PATENTS

| | | |
|---|---|---|
| 2,298,436 | Usselman | Oct. 13, 1942 |
| 2,426,295 | Born | Aug. 26, 1947 |
| 2,443,746 | Peterson | June 22, 1948 |
| 2,531,103 | Beckwith | Nov. 21, 1950 |